United States Patent
Kim et al.

(10) Patent No.: US 10,326,109 B2
(45) Date of Patent: Jun. 18, 2019

(54) FLEXIBLE ORGANIC LIGHT EMITTING DIODE DISPLAY DEVICE

(71) Applicant: LG Display Co., Ltd., Seoul (KR)

(72) Inventors: Gi-Youn Kim, Goyang-si (KR); Jae-Young Lee, Paju-si (KR); Wan-Soo Lee, Jeonju-si (KR)

(73) Assignee: LG Display Co., Ltd., Seoul (KR)

( * ) Notice: Subject to any disclaimer, the term of this patent is extended or adjusted under 35 U.S.C. 154(b) by 51 days.

(21) Appl. No.: 14/963,131

(22) Filed: Dec. 8, 2015

(65) Prior Publication Data
US 2016/0351852 A1     Dec. 1, 2016

(30) Foreign Application Priority Data

May 28, 2015 (KR) .......................... 10-2015-0074968

(51) Int. Cl.
  *H01L 51/52*  (2006.01)
  *H01L 51/00*  (2006.01)
  *H01L 27/32*  (2006.01)

(52) U.S. Cl.
  CPC ...... *H01L 51/5256* (2013.01); *H01L 27/3244* (2013.01); *H01L 51/0097* (2013.01); *H01L 2251/5338* (2013.01)

(58) Field of Classification Search
  CPC ............. H01L 51/5256; H01L 27/3244; H01L 51/0097; H01L 2251/5338
  See application file for complete search history.

(56) References Cited

U.S. PATENT DOCUMENTS 6,624,568 B2     9/2003  Silvernail
2014/0353625 A1* 12/2014  Yi ....................... H01L 51/5253
                                                            257/40
(Continued)

FOREIGN PATENT DOCUMENTS

CN    1399502 A    2/2003
CN    1487779 A    4/2004
(Continued)

OTHER PUBLICATIONS

State Intellectual Property Office of the People's Republic of China, First Office Action, Chinese Patent Application No. 201511030058. 1, dated Jul. 31, 2017, twenty-one pages.

*Primary Examiner* — Fernando L Toledo
*Assistant Examiner* — Neil R Prasad
(74) *Attorney, Agent, or Firm* — Fenwick & West LLP

(57) ABSTRACT

Embodiments relate to a flexible organic light emitting diode (OLED) display device and a method for manufacturing the flexible OLED display device. The display device includes a multi-layered encapsulation film coving pixel regions of the display device, and a metal layer on or within at least a portion of the encapsulation film, the portion in a bending region of the flexible substrate. The multi-layered encapsulation film includes at least a first inorganic layer, an organic layer, and a second inorganic layer. The metal layer is formed in the bending region such that the stress generated in the encapsulation film by folding, bending, or rolling operations in the bending region is reduced by the metal layer. The metal layer prevents generation of cracks in the encapsulation film and thus, prevents moisture penetration into the display area of the display device.

20 Claims, 10 Drawing Sheets

(56) References Cited

U.S. PATENT DOCUMENTS

| | | | |
|---|---|---|---|
| 2015/0035431 A1* | 2/2015 | Lee .................... | H01L 51/5253 |
| | | | 313/504 |
| 2015/0042346 A1* | 2/2015 | Oh ..................... | H01L 51/0031 |
| | | | 324/414 |
| 2015/0162565 A1* | 6/2015 | Ryu ................... | H01L 51/5256 |
| | | | 257/40 |

FOREIGN PATENT DOCUMENTS

| CN | 1934700 A | 3/2007 |
|---|---|---|
| CN | 104347822 A | 2/2015 |

\* cited by examiner

FLEXIBLE ORGANIC LIGHT EMITTING DIODE DISPLAY DEVICE

CROSS-REFERENCE TO RELATED APPLICATION

The present application claims the benefit of Republic of Korea Patent Application No. 10-2015-0074968 filed on May 28, 2015, which is hereby incorporated by reference herein in its entirety.

BACKGROUND OF THE INVENTION

Field of the Invention

The present invention relates to an organic light emitting diode (OLED) display device and more particularly to a flexible OLED display device being capable of preventing damages on a light emitting diode.

Discussion of the Related Art

Various display devices are currently being used for displaying images. A flat panel display devices, such as a liquid crystal display (LCD) device, a plasma display panel (PDP) and an organic light emitting diode (OLED) display device, are widely researched and used instead of a cathode ray tube (CRT) display device because of their excellent capabilities of a thin profile and light weight.

Among flat panel display devices, since the OLED display device has advantages in a response time, a contrast ratio, a viewing angle and power consumption, the OLED display device is widely researched.

A light emitting diode including an organic emitting layer is very weak to moisture. To prevent the moisture to the light emitting diode and protect the light emitting diode, an encapsulation substrate of glass is attached on the light emitting diode.

Recently, flexible display devices, e.g., a foldable display device, a bendable display device or a rollable display device, were introduced. In the flexible display device, new encapsulation film including an inorganic layer and an organic layer is used instead of the glass encapsulation substrate.

FIG. 1 is a schematic cross-sectional view of the related art OLED display device. As shown in FIG. 1, the OLED display device 1 includes a flexible substrate 10, where a display area AA and a non-display area NA at peripheries of the display area AA are defined, a light emitting diode D on the flexible substrate 10 and an encapsulation film 20 covering the light emitting diode D.

The flexible substrate 10 may be formed of polymer such as polyimide, and the light emitting diode D is formed on the flexible substrate 10.

The light emitting diode D is disposed in the display area AA, and a driving unit (not shown) for driving the light emitting diode D may be formed in the non-display area NA.

Although not shown, the light emitting diode D includes a first electrode, a second electrode facing the first electrode, and an organic emitting layer therebetween. In addition, a switching thin film transistor (TFT) as a switching element and a driving TFT as a driving element are formed in each pixel region and on the flexible substrate 10. For example, the first electrode of the light emitting diode D may be connected to the driving TFT.

The encapsulation film 20 covers the light emitting diode D and corresponds to the display area AA and the non-display area NA. The damages on the light emitting diode D in a condition of high temperature and high humidity are prevented by the encapsulation film 20.

In the encapsulation film 20, an inorganic layer and an organic layer are alternately stacked. For example, the encapsulation film 20 may include a first inorganic layer 22 on the light emitting diode D, an organic layer 24 on the first inorganic layer 22 and a second inorganic layer 26 on the organic layer 24. Namely, the encapsulation film 20 may have a triple-layered structure.

In addition, a barrier film 30 may be attached to the encapsulation film 20 using an adhesion layer 32.

However, when the OLED display device is repeatedly folded, repeatedly bent or repeatedly rolled, there are damages in the light emitting diode D. Accordingly, displaying quality and/or lifespan issues arise in the OLED display device 1 of related art.

SUMMARY OF THE INVENTION

Embodiments relate to an organic light emitting diode (OLED) display device that includes a flexible substrate having a display area and a non-display area, a plurality of pixel regions on the display area of the flexible substrate, in which each pixel region includes an organic light emitting diode, a multi-layered encapsulation film covering the plurality of pixel regions, the multi-layered encapsulation film including a first inorganic layer, a first organic layer, and a second inorganic layer, and a metal layer on or within at least a portion of the multi-layered encapsulation film, wherein the portion of the multi-layered encapsulation film is in a bending region of the flexible substrate where the flexible substrate is folded, bent, or rolled.

In one embodiment, the metal layer spans an entire surface of the flexible substrate.

In one embodiment, a first length of the metal layer along a first direction of the bending region is smaller or equal to a first length of the flexible substrate but larger than a first length of the encapsulation film, and a width of the metal layer along a second direction perpendicular to the first direction is smaller than a second length of the encapsulation film and a second length of the flexible substrate.

In one embodiment, the metal layer is above the second inorganic layer.

In one embodiment, the metal layer is between the first inorganic layer and the first organic layer.

In one embodiment, the first length of the metal layer is equal to a first length of the first inorganic layer.

In one embodiment, the metal layer is between the first organic layer and the second inorganic layer.

In one embodiment, the metal layer includes a first pattern on or within a first end of the encapsulation film extending from one end of the bending region, and a second pattern on or within a second end of the encapsulation film extending from an opposite end of the bending region and spaced apart from the first pattern.

In one embodiment, the first and second patterns of the metal layer are above the second inorganic layer.

In one embodiment, the first and second patterns of the metal layer are between the first inorganic layer and the first organic layer.

In one embodiment, the first and second patterns of the first metal layer are between the first organic layer and the second inorganic layer.

In one embodiment, the metal layer is formed from at least one of silver (Ag), gold (Au), palladium (Pd), or their alloys, and a thickness of the metal layer is 100 to 200 angstroms.

In one embodiment, the display device further includes an adhesion layer on the encapsulation film, a barrier film on the adhesion layer.

Embodiments also relate to a method of fabricating an organic light emitting diode (OLED) display device. A plurality of pixel regions are formed on a display area of a flexible substrate, each pixel region including an organic light emitting diode. A first inorganic layer is formed on the plurality of pixel regions. A first organic layer is formed after forming the first inorganic layer. A second inorganic layer is formed after forming the first organic layer. A metal layer is formed on at least a portion of the display device after forming the plurality of pixel regions. The portion of the display device is in a bending region of the flexible substrate where the flexible substrate is folded, bend, or rolled.

In one embodiment, the metal layer is formed across an entire surface of the flexible substrate.

In one embodiment, a first length of the metal layer along a first direction of the bending region is smaller or equal to a first length of the flexible substrate but larger than a first length of the second inorganic layer, and a width of the metal layer along a second direction perpendicular to the first direction is smaller than a second length of the second inorganic layer and a second length of the flexible substrate.

In one embodiment, when forming the metal layer, a first pattern is formed to extend from one end of the bending region, and a second pattern is formed to extend from another end of the bending region, the second pattern spaced apart from the first pattern.

In one embodiment, the metal layer is formed after forming the first inorganic layer but before forming the first organic layer, in which a first length of the metal layer is equal to a first length of the first inorganic layer.

In one embodiment, the metal layer is formed from at least one of silver (Ag), gold (Au), palladium (Pd), or their alloys, and a thickness of the metal layer is 100 to 200 angstroms.

In one embodiment, an adhesion layer is formed on the second inorganic layer, and a barrier film is formed on the adhesion layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

In the OLED display device, since the cracks are generated in an encapsulation film at an edge in a folding region, a bending region or a rolling region, the damages on the light emitting diode may be generated.

Namely, when the display device is folded, bent or rolled, the stress is concentrated in the encapsulation film at the edge in the folding region, the bending region or the rolling region, the cracks may be generated in the encapsulation film, and the moisture may penetrate into the display area of the display device through the cracks.

Accordingly, in the related art flexible OLED display device, the light emitting diode and/or thin film transistors are damaged such that the displaying quality and/or the life time of the related art flexible OLED display device is decreased.

Figure 1:
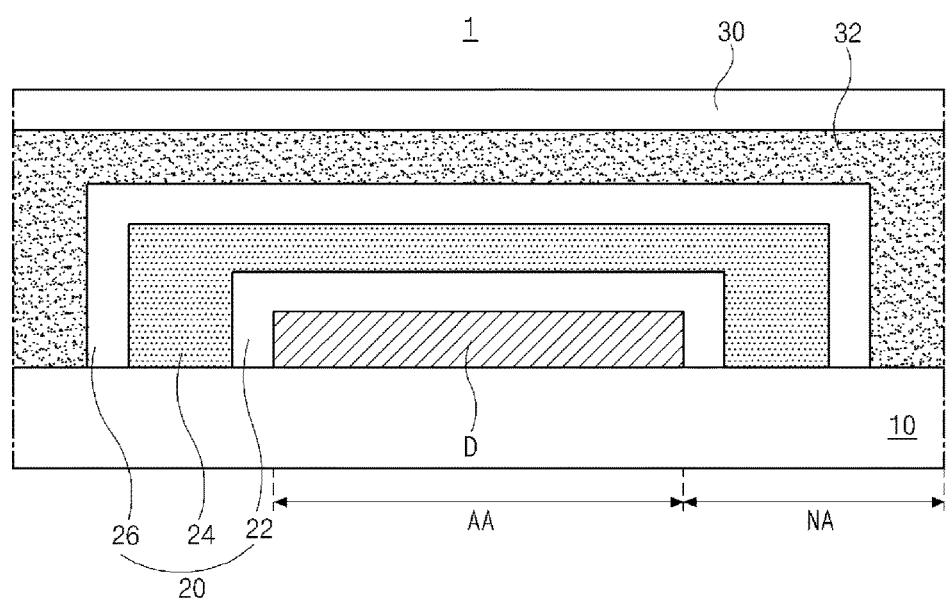
FIG. 1 is a schematic cross-sectional view an OLED display device of related art.
Figure 2:
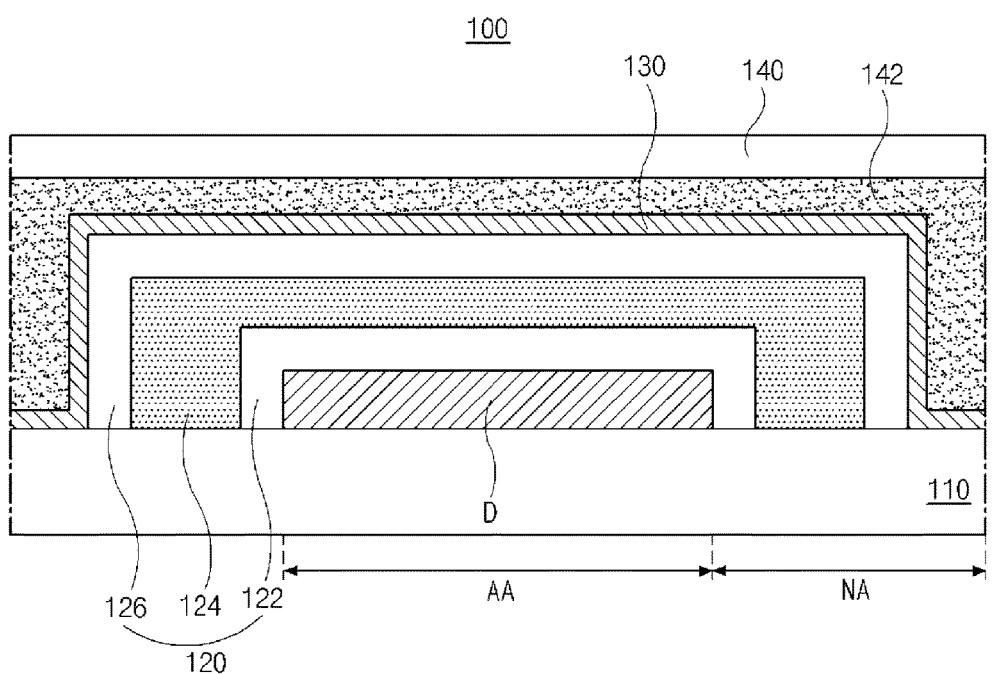
FIG. 2 is a schematic cross-sectional view of a flexible OLED display device according to a first embodiment of the present invention.

FIG. 2 is a schematic cross-sectional view of a flexible OLED display device according to a first embodiment of the present invention. A flexible OLED display device 100 according to the first embodiment of the present invention includes a flexible substrate 110, where a display area AA and a non-display area NA at peripheries of the display area AA are defined, a light emitting diode D on the flexible substrate 110, an encapsulation film 120 covering the light emitting diode D and a metal layer (or "metal pattern") 130 covering the encapsulation film 120.

The flexible substrate 110 may be formed of polymer such as polyimide. However, it is not limited thereto.

The light emitting diode D is formed on or over the flexible substrate 110. The light emitting diode D is positioned in the display area AA, and a driving unit (not shown) for driving the light emitting diode D may be positioned in the non-display area NA.

The light emitting diode D includes a first electrode (not shown), a second electrode (not shown) facing the first electrode and an organic emitting layer (not shown) therebetween. In addition, a switching thin film transistor (TFT) (not shown) as a switching element and a driving TFT (not shown) as a driving element are formed on the flexible substrate 110 and in each pixel region. The first electrode of the light emitting diode D is connected to the driving TFT.

The encapsulation film 120 covers the light emitting diode D and corresponds to the display area AA and the non-display area NA. The moisture penetration into the elements in the display area AA, e.g., the light emitting diode D, is prevented by the encapsulation film 120. As a result, the damages on the light emitting diode D can be reduced.

The encapsulation film 120 includes an inorganic layer and an organic layer alternately stacked on the light emitting diode D. The encapsulation film 120 may have a triple-layered structure of a first inorganic layer 122 on the light emitting diode D, an organic layer 124 on the first inorganic layer 122 and a second inorganic layer 126 on the organic layer 124. However, the placement or structure of the encapsulation film is not limited thereto.

Each of the first and second inorganic layers 122 and 126 may be formed of, but is not limited to, at least one material selected from an inorganic material including silicon oxide (SiOx), silicon nitride (SiNx) and aluminum oxide (AlOx). The organic layer 124 may be formed of, but is not limited to, a thermosetting or a UV curable material, e.g., epoxy compounds, acryl compounds, urethane compound, rubber compounds.

For example, an organic layer may be further formed on the second inorganic layer 126 such that the encapsulation film 120 may have a quadruple-layered structure, or an organic layer and an inorganic layer may be stacked on the second inorganic layer 126 such that the encapsulation film 120 may have a five-layered structure.

The metal layer 130 covers the encapsulation film 120 and corresponds to an entire surface of the flexible substrate 110.

The metal layer 130 may include a low stiffness material. Namely, the metal layer 130 may include a metallic material having a low modulus value. For example, the metal layer 130 may include silver (Ag), gold (Au), paladium (Pd) or their alloys. However, it is not limited thereto. In one embodiment, the metal layer 130 may be deposited by sputtering, or any deposition method used to deposit a metal material.

The moisture penetration into the display area AA is blocked by the metal layer 130. In addition, the stress generated in the encapsulation film 120 during the folding, bending or rolling operation is reduced by the metal layer 130. Accordingly, the generation of the cracks in the encapsulation film 120 by the folding, bending or rolling operation is prevented.

A barrier film 140 further minimizing the moisture penetration and protecting the metal layer 130 and the encapsulation film 120 may be attached onto the metal layer 130 using an adhesion layer 142. For example, the adhesion layer 142 may be a pressure sensitive adhesive. The barrier film 140 and the adhesion layer 142 may be omitted.

Alternatively, a polarization plate (not shown) may be attached on an outer side of the barrier film 140 to reduce ambient light reflection and increase a contrast ratio. In this instance, the polarization plate may be a circular polarization plate.

As mentioned above, by forming the metal layer 130 having a low modulus property on the encapsulation film 120, the generation of the cracks in the encapsulation film 120 is prevented such that the damages on the elements, e.g., the light emitting diode D, by the moisture penetration is prevented.

Accordingly, the displaying quality and the lifetime of the flexible OLED display device 100 are improved.

However, when the flexible OLED display device 100 is a top emission type, the transmittance of the flexible OLED display device 100 is reduced because the metal layer 130 covers an entire surface of the flexible substrate 110.

Figure 3:
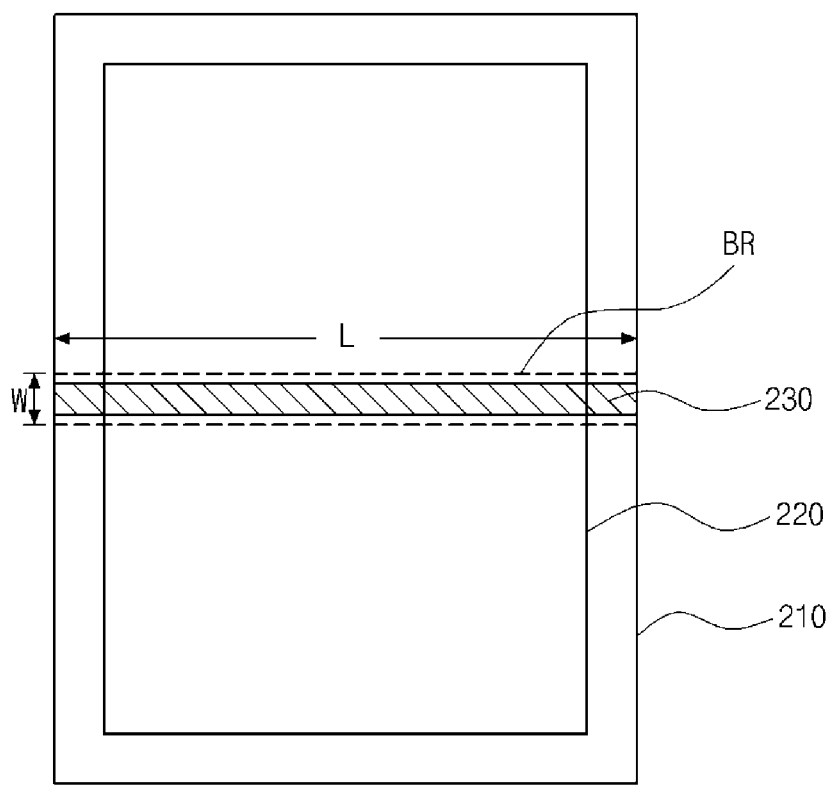
FIG. 3 is a schematic plane view of a flexible OLED display device according to a second embodiment of the present invention.
Figure 4:
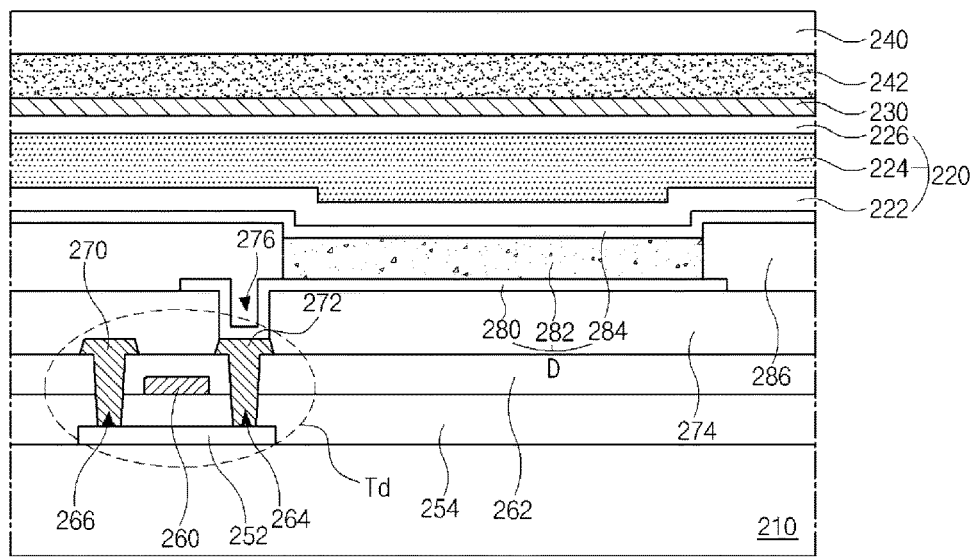
FIG. 4 is a schematic cross-sectional view illustrating one pixel region including a light emitting diode, according to one embodiment of the present invention.

FIG. 3 is a schematic plane view of a flexible OLED display device according to a second embodiment of the present invention, and FIG. 4 is a schematic cross-sectional view illustrating one pixel region including a light emitting diode.

Referring to FIGS. 3 and 4, a flexible OLED display device 200 according to the second embodiment of the present invention includes a flexible substrate 210, where a display area AA and a non-display area NA at peripheries of the display area AA are defined, a light emitting diode D on the flexible substrate 210, an encapsulation film 220 covering the light emitting diode D and a metal layer 230 positioned in a bending region BR and covering the encapsulation film 220. A region, where the flexible OLED display device 200 of the present invention is folded, bent and/or rolled, is defined as the bending region BR.

The flexible substrate 210 may be formed of polymer such as polyimide. However, it is not limited thereto. Although not shown, a buffer layer, which is formed of an inorganic material, such as silicon oxide or silicon nitride, may be formed on the flexible substrate 210.

On or over the flexible substrate 210, a driving TFT Td and a light emitting diode D, which is connected to the driving TFT Td, is formed.

In addition, a gate line (not shown) and a data line (not shown), which cross each other to define a pixel region, a power line (not shown), which is parallel to and spaced apart from the gate line or the data line, a switching TFT (not shown), which is connected to the gate and data lines, a storage capacitor (not shown), which is connected to the power line and an electrode of the switching TFT, are further formed on the flexible substrate 210.

The driving TFT Td is connected to the switching TFT and includes a semiconductor layer 252, a gate electrode 260, a source electrode 270 and a drain electrode 272.

The semiconductor layer 252 is disposed on the flexile substrate 210 and may include an oxide semiconductor material or polycrystalline silicon.

When the semiconductor layer 252 includes the oxide semiconductor material, a light-shielding pattern (not shown) may be formed under the semiconductor layer 252. The light to the semiconductor layer 252 is shielded or blocked by the light-shielding pattern such that thermal degradation of the semiconductor layer 252 can be prevented. On the other hand, when the semiconductor layer 252 includes polycrystalline silicon, impurities may be doped into both sides of the semiconductor layer 252.

A gate insulating layer 254 is formed on an entire surface of the flexible substrate 210 including the semiconductor layer 252. The gate insulating layer 254 may be formed of an inorganic insulating material such as silicon oxide or silicon nitride.

A gate electrode 260, which is formed of a conductive material, e.g., metal, is formed on the gate insulating layer 254 to correspond to a center of the semiconductor layer 252. The gate electrode 260 is connected to the switching TFT.

In FIG. 4, the gate insulating layer 254 is formed on the entire surface of the flexible substrate 210. Alternatively, the gate insulating layer 254 may be patterned to have the same shape as the gate electrode 260.

An interlayer insulating layer 262, which is formed of an insulating material, is formed on an entire surface of the flexible substrate 210 including the gate electrode 260. The interlayer insulating layer 262 may be formed of an inorganic insulating material, e.g., silicon oxide or silicon nitride, or an organic insulating material, e.g., benzocyclobutene or photo-acryl.

The interlayer insulating layer 262 includes first and second contact holes 264 and 266 exposing both sides of the semiconductor layer 252. The first and second contact holes 264 and 266 are positioned at both sides of the gate electrode 260 to be spaced apart from the gate electrode 260.

In FIG. 4, the first and second contact holes 264 and 266 extend into the gate insulating layer 254. Alternatively, when the gate insulating layer 254 is patterned to have the same shape as the gate electrode 260, there may be no first and second contact holes 264 and 266 in the gate insulating layer 254.

A source electrode 270 and a drain electrode 272, which are formed of a conductive material, e.g., metal, are formed on the interlayer insulating layer 262. The drain electrode 272 and the source electrode 270 are spaced apart from each other with respect to the gate electrode 260 and respectively contact both sides of the semiconductor layer 252 through the first and second contact holes 264 and 266. The source electrode 270 is connected to the power line (not shown).

The semiconductor layer 252, the gate electrode 260, the source electrode 270 and the drain electrode 272 constitute the driving TFT Td. In FIG. 4, the gate electrode 260, the source electrode 270 and the drain electrode 272 are positioned over the semiconductor layer 252. Namely, the driving TFT Td has a coplanar structure.

Alternatively, in the driving TFT Td, the gate electrode may be positioned under the semiconductor layer, and the source and drain electrodes may be positioned over the semiconductor layer such that the driving TFT Td may have an inverted staggered structure. In this instance, the semiconductor layer may include amorphous silicon.

The switching TFT (not shown) may have substantially the same structure as the driving TFT Td.

A passivation layer 274, which includes a drain contact hole 276 exposing the drain electrode 272 of the driving TFT Td, is formed to cover the driving TFT Td.

A first electrode 280, which is connected to the drain electrode 272 of the driving TFT Td through the drain contact hole 276, is separately formed in each pixel region. The first electrode 280 may be an anode and may be formed a conductive material having a relatively high work function. For example, the first electrode 280 may be formed of a transparent conductive material such as indium-tin-oxide (ITO) or indium-zinc-oxide (IZO).

When the flexible OLED display device 200 is operated in a bottom-emission type, the first electrode 280 may have a single-layered structure formed of the transparent conductive material.

On the other hand, when the flexible OLED display device 200 is operated in a top-emission type, a reflection electrode or a reflection layer may be formed under the first electrode 280. For example, the reflection electrode or the reflection layer may be formed of aluminum-paladium-copper (APC) alloy.

A bank layer 286, which covers edges of the first electrode 280, is formed on the passivation layer 274. A center of the first electrode 280 in the pixel region is exposed through an opening of the bank layer 286.

An organic emitting layer 282 is formed on the first electrode 280. The organic emitting layer 282 may have a single-layered structure of an emitting material layer formed of an emitting material. Alternatively, to improve emitting efficiency, the organic emitting layer 282 may have a multi-layered structure including a hole injection layer, a hole transporting layer, the emitting material layer, an electron transporting layer and an electron injection layer sequentially stacked on the first electrode 280.

A second electrode 284 is formed over the flexible substrate 210 including the organic emitting layer 282. The second electrode 284 is positioned at an entire surface of the display area AA. The second electrode 284 may be a cathode and may be formed of a conductive material having a relatively low work function. For example, the second electrode 284 may be formed of aluminum (Al), magnesium (Mg) or Al—Mg alloy.

The first electrode 280, the organic emitting layer 282 and the second electrode 284 constitute the light emitting diode D.

An encapsulation film 220 is formed on the light emitting diode D to prevent penetration of moisture into the light emitting diode D.

The encapsulation film 220 has a triple-layered structure of a first inorganic layer 222, an organic layer 224 and a second inorganic layer 226. However, it is not limited thereto.

Each of the first and second inorganic layers 222 and 226 may be formed of at least one material selected from an inorganic material including silicon oxide (SiOx), silicon nitride (SiNx) and aluminum oxide (AlOx). However, it is not limited thereto. The organic layer 224 may be formed of a thermosetting or a UV curable material, e.g., epoxy compounds, acryl compounds, urethane compound, rubber compounds. However, it is not limited thereto.

For example, an organic layer may be further formed on the second inorganic layer 226 such that the encapsulation film 220 may have a quadruple-layered structure, or an organic layer and an inorganic layer may be stacked on the second inorganic layer 226 such that the encapsulation film 220 may have a five-layered structure.

The metal pattern 230 covers the encapsulation film 220 and runs across the flexible substrate 210. Namely, the metal pattern 230 has a length L, i.e., a horizontal length, being equal to or smaller than the flexible substrate 210 and being larger than the encapsulation film 220.

For example, as shown in FIG. 3, the metal pattern 230 has the same length as the flexible substrate 210. Alternatively, an end of the metal pattern 230 may be disposed between an end of the flexible substrate 210 and an end of the encapsulation film 220 such that the length L of the metal pattern 230 may be smaller than the flexible substrate 210.

In addition, the metal pattern 230 is positioned in the bending region BR. Namely, the metal pattern 230 has a width W, i.e., a vertical length, being smaller than the flexible substrate 210 and the encapsulation film 220. The width W of the metal pattern 230 may be determined according to a curvature radius of the flexible OLED display device 200.

In FIG. 3, since the bending region BR is defined along a short side of the flexible substrate 210, the length L of the metal pattern 230 along a first direction of the bending region is equal to the length of the short side of the flexible substrate 210, and the width W of the metal pattern 230 along a second direction perpendicular to the first direction is smaller than a the length of a long side of the flexible substrate 210.

Alternatively, when the bending region BR may be defined along the long side of the flexible substrate 210, the length L of the metal pattern 230 along a first direction of the bending region may be equal to the length of the long side of the flexible substrate 210, and the width W of the metal pattern 230 along a second direction perpendicular to the first direction may be smaller than a the length of the short side of the flexible substrate 210.

The metal pattern 230 may include a material of low stiffness. Namely, the metal pattern 230 may include a metallic material having a low modulus value. For example, the metal pattern 230 may include silver (Ag), gold (Au), paladium (Pd) or their alloys. However, it is not limited thereto.

The metal pattern 230 may have a thickness of about 100 to 200 angstroms. In a top emission type OLED display device, a transmittance of the display device may be decreased by the metal pattern 230. However, when the metal pattern 230 has the thickness of the above range, the transmittance of the display device is increased due to the Surface Plasmon Effect in comparison to the display device without the metal pattern 230.

Namely, when the metal pattern 230 does not have the thickness of the above range, the light may be blocked by the metal pattern 230 such that the transmittance of the display device is decreased. However, the transmittance of the flexible display device 200 including the metal pattern 230 with the above ranged thickness may be increased due to the Surface Plasmon Effect.

Moisture is blocked and the stress concentrated in the encapsulation film 220 during the folding, bending and/or rolling operation is relieved by the metal pattern 230. Accordingly, the cracks are not generated in the encapsulation film 220 by the folding, bending and/or rolling operation.

In addition, since the metal pattern 230 is formed in the bending region BR, the transmittance decrease of the top emission type flexible OLED display device, where the light from the organic emitting layer 282 passes through the second electrode 284 to display images, is minimized regardless of the thickness of the metal pattern 230.

A barrier film 240 further minimizing the moisture penetration and protecting the metal pattern 230 and the encapsulation film 220 may be attached onto the metal pattern 230 using an adhesion layer 242. For example, the adhesion layer 242 may be a pressure sensitive adhesive. The barrier film 240 and the adhesion layer 242 may be omitted.

Alternatively, a polarization plate (not shown) may be attached on an outer side of the barrier film 240 to reduce ambient light reflection and increase a contrast ratio. In this instance, the polarization plate may be a circular polarization plate.

As mentioned above, by forming the metal pattern 230 having a low modulus property on the encapsulation film 220, the generation of the cracks in the encapsulation film 220 is prevented such that the damages on the elements, e.g., the light emitting diode D, by the moisture penetration is prevented.

Accordingly, the displaying quality and the lifetime of the flexible OLED display device 200 are improved, and a relatively small curvature radius can be provided in the flexible OLED display device 200.

In addition, since the metal pattern 230 is positioned in the bending region BR, the transmittance decrease of the flexible OLED display device 200 can be minimized.

Figure 5:
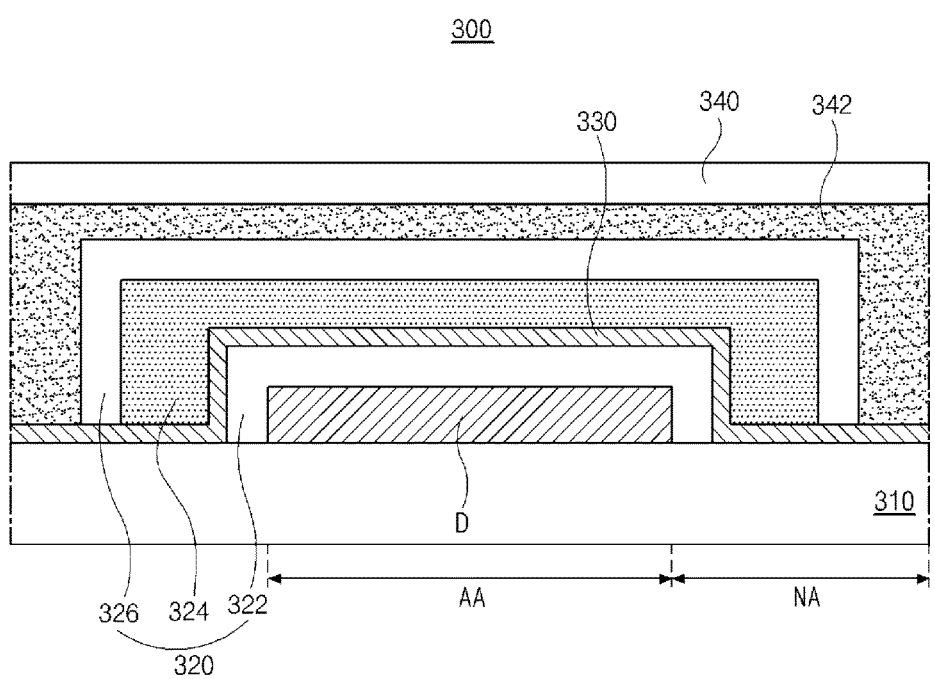
FIG. 5 is a schematic cross-sectional view of a flexible OLED display device according to a third embodiment of the present invention.

FIG. 5 is a schematic cross-sectional view of a flexible OLED display device according to a third embodiment of the present invention.

Referring to FIG. 5, a flexible OLED display device 300 according to the third embodiment of the present invention includes a flexible substrate 310, where a display area AA and a non-display area NA at peripheries of the display area AA are defined, a light emitting diode D, which is disposed on the flexible substrate 310, an encapsulation film 320, which covers the light emitting diode D and includes a first inorganic layer 322, an organic layer 324 and a second inorganic layer 326, and a metal layer 330 positioned in a bending region BR (of FIG. 3) and between the first inorganic layer 322 and the organic layer 324. A region, where the flexible OLED display device 300 of the present invention is folded, bent and/or rolled, is defined as the bending region BR.

The flexible substrate 310 may be formed of polymer such as polyimide. However, it is not limited thereto.

On or over the flexible substrate 310, a driving TFT Td and a light emitting diode D, which is connected to the driving TFT Td, is formed.

As illustrated with FIG. 4, the driving TFT Td includes the semiconductor layer 252, the gate electrode 260, the source electrode 270 and the drain electrode 272, and the light emitting diode D includes the first electrode 280, which is connected to the drain electrode 272, the second electrode 284, which faces the first electrode 280, and the organic emitting layer 282 therebetween.

The encapsulation film 320 is formed on the light emitting diode D to prevent the moisture penetration into the light emitting diode D.

The encapsulation film 320 has a quadruple-layered structure of the first inorganic layer 322, the organic layer 324 and the second inorganic layer 326. However, it is not limited thereto.

Each of the first and second inorganic layers 322 and 326 may be formed of at least one material selected from an inorganic material including silicon oxide (SiOx), silicon nitride (SiNx) and aluminum oxide (AlOx). However, it is not limited thereto. The organic layer 324 may be formed of a thermosetting or a UV curable material, e.g., epoxy compounds, acryl compounds, urethane compound, rubber compounds. However, it is not limited thereto.

For example, an organic layer may be further formed on the second inorganic layer 326 such that the encapsulation film 320 may have a quadruple-layered structure, or an organic layer and an inorganic layer may be stacked on the second inorganic layer 326 such that the encapsulation film 320 may have a five-layered structure.

The metal pattern 330 is positioned between the first inorganic layer 322 and the organic layer 324 and in the bending region BR (of FIG. 3). Namely, unlike the second embodiment of the present invention, the metal pattern 330 in the flexible OLED display device 300 according to the third embodiment of the present invention runs through the encapsulation film 320.

Since the main or final element for preventing the moisture penetration into the light emitting diode D is the first inorganic layer 322, the metal pattern 330 is formed between the first inorganic layer 322 and the organic layer 324 to efficiently prevent the generation of the cracks in the first inorganic layer 322. Namely, the metal pattern 330 is formed to contact an upper surface of the first inorganic layer 322 which is closer to the light emitting diode D than other elements of the encapsulation film 320.

The metal pattern 330 has a length L, i.e., a horizontal length, being equal to or smaller than the flexible substrate 310 and being larger than the encapsulation film 320.

For example, as shown in FIG. 5, the metal pattern 330 has the same length as the flexible substrate 310. Alternatively, an end of the metal pattern 330 may be disposed between an end of the flexible substrate 310 and an end of the encapsulation film 320 such that the length L of the metal pattern 330 may be smaller than the flexible substrate 310.

In addition, the metal pattern 330 is positioned in the bending region BR. Namely, the metal pattern 330 has a width W, i.e., a vertical length, being smaller than the flexible substrate 310 and the encapsulation film 320. The width W of the metal pattern 330 may be determined according to a curvature radius of the flexible OLED display device 300.

The metal pattern 330 may include a material of low stiffness. Namely, the metal pattern 330 may include a metallic material having a low modulus value. For example, the metal pattern 330 may include silver (Ag), gold (Au), paladium (Pd) or their alloys. However, it is not limited thereto.

The metal pattern 330 may have a thickness of about 100 to 200 angstroms. When the metal pattern 330 has the thickness of the above range, the transmittance of the display device is increased due to the Surface Plasmon Effect in comparison to the display device without the metal pattern 330.

Moisture is blocked and the stress concentrated in the first inorganic layer 322 of the encapsulation film 320 during the folding, bending and/or rolling operation is relieved by the metal pattern 330. Accordingly, the cracks are not generated in the first inorganic layer 322 of the encapsulation film 320 by the folding, bending and/or rolling operation.

In addition, since the metal pattern 330 is formed in the bending region BR, the transmittance decrease of the top emission type flexible OLED display device is minimized regardless of the thickness of the metal pattern 330.

A barrier film 340 further minimizing the moisture penetration and protecting the encapsulation film 320 may be attached onto the second inorganic layer 326 of the encapsulation film 320 using an adhesion layer 342. For example, the adhesion layer 342 may be a pressure sensitive adhesive. The barrier film 340 and the adhesion layer 342 may be omitted.

Alternatively, a polarization plate (not shown) may be attached on an outer side of the barrier film 340 to reduce ambient light reflection and increase a contrast ratio. In this instance, the polarization plate may be a circular polarization plate.

As mentioned above, by forming the metal pattern 330 having a low modulus property on the first inorganic layer 322 of the encapsulation film 320, the generation of the cracks in the first inorganic layer 322 of the encapsulation film 320 is prevented such that the damages on the elements, e.g., the light emitting diode D, by the moisture penetration is prevented.

Accordingly, the displaying quality and the lifetime of the flexible OLED display device 300 are improved, and a relatively small curvature radius can be provided in the flexible OLED display device 300.

In addition, since the metal pattern 330 is positioned in the bending region BR, the transmittance decrease of the flexible OLED display device 300 can be minimized.

Figure 6:
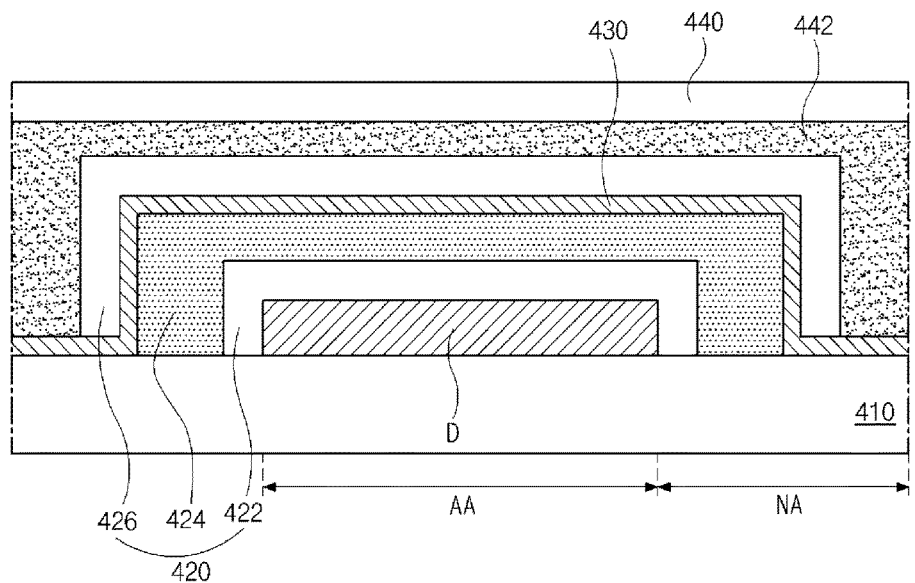
FIG. 6 is a schematic cross-sectional view of a flexible OLED display device according to a fourth embodiment of the present invention.

FIG. 6 is a schematic cross-sectional view of a flexible OLED display device according to a fourth embodiment of the present invention.

Referring to FIG. 6, a flexible OLED display device 400 according to the fourth embodiment of the present invention includes a flexible substrate 410, where a display area AA and a non-display area NA at peripheries of the display area AA are defined, a light emitting diode D, which is disposed on the flexible substrate 410, an encapsulation film 420, which covers the light emitting diode D and includes a first inorganic layer 422, an organic layer 424 and a second inorganic layer 426, and a metal layer 430 positioned in a bending region BR (of FIG. 3) and between the organic layer 424 and the second inorganic layer 426. A region, where the flexible OLED display device 400 of the present invention is folded, bent and/or rolled, is defined as the bending region BR.

The flexible substrate 410 may be formed of polymer such as polyimide. However, it is not limited thereto.

On or over the flexible substrate 410, a driving TFT Td and a light emitting diode D, which is connected to the driving TFT Td, is formed.

As illustrated with FIG. 4, the driving TFT Td includes the semiconductor layer 252, the gate electrode 260, the source electrode 270 and the drain electrode 272, and the light emitting diode D includes the first electrode 280, which is connected to the drain electrode 272, the second electrode 284, which faces the first electrode 280, and the organic emitting layer 282 therebetween.

The encapsulation film 420 is formed on the light emitting diode D to prevent the moisture penetration into the light emitting diode D.

The encapsulation film 420 has a triple-layered structure of the first inorganic layer 422, the organic layer 424 and the second inorganic layer 426. However, it is not limited thereto.

Each of the first and second inorganic layers 422 and 426 may be formed of at least one material selected from an inorganic material including silicon oxide (SiOx), silicon nitride (SiNx) and aluminum oxide (AlOx). However, it is not limited thereto. The organic layer 424 may be formed of a thermosetting or a UV curable material, e.g., epoxy compounds, acryl compounds, urethane compound, rubber compounds. However, it is not limited thereto.

For example, an organic layer may be further formed on the second inorganic layer 426 such that the encapsulation film 420 may have a quadruple-layered structure, or an organic layer and an inorganic layer may be stacked on the second inorganic layer 426 such that the encapsulation film 420 may have a five-layered structure.

The metal pattern 430 is positioned between the organic layer 424 and the second inorganic layer 426 and in the bending region BR (of FIG. 3). Namely, unlike the second embodiment of the present invention, the metal pattern 430 in the flexible OLED display device 300 and 400 according to the second and third embodiments of the present invention runs through the encapsulation film 320 and 420 and positioned inside the encapsulation film 320 and 420.

The metal pattern 430 has a length L, i.e., a horizontal length, being equal to or smaller than the flexible substrate 410 and being larger than the encapsulation film 420.

For example, as shown in FIG. 6, the metal pattern 430 has the same length as the flexible substrate 410. Alternatively, an end of the metal pattern 430 may be disposed between an end of the flexible substrate 410 and an end of the encapsulation film 420 such that the length L of the metal pattern 430 may be smaller than the flexible substrate 410.

In addition, the metal pattern 430 is positioned in the bending region BR. Namely, the metal pattern 430 has a width W, i.e., a vertical length, being smaller than the flexible substrate 410 and the encapsulation film 420. The width W of the metal pattern 430 may be determined according to a curvature radius of the flexible OLED display device 400.

The metal pattern 430 may include a material of low stiffness. Namely, the metal pattern 430 may include a metallic material having a low modulus value. For example, the metal pattern 430 may include silver (Ag), gold (Au), paladium (Pd) or their alloys. However, it is not limited thereto.

The metal pattern 430 may have a thickness of about 100 to 200 angstroms. When the metal pattern 430 has the thickness of the above range, the transmittance of the display device is increased due to the Surface Plasmon Effect in comparison to the display device without the metal pattern 430.

Moisture is blocked and the stress concentrated in the organic layer 424 and the first inorganic layer 422 of the encapsulation film 420 during the folding, bending and/or rolling operation is relieved by the metal pattern 430. Accordingly, the cracks are not generated in the first inorganic layer 422 and the organic layer 424, particularly in the first inorganic layer 422, of the encapsulation film 420 by the folding, bending and/or rolling operation.

In addition, since the metal pattern 430 is formed in the bending region BR, the transmittance decrease of the top emission type flexible OLED display device is minimized regardless of the thickness of the metal pattern 430.

A barrier film 440 further minimizing the moisture penetration and protecting the encapsulation film 420 may be attached onto the second inorganic layer 426 of the encapsulation film 420 using an adhesion layer 442. For example, the adhesion layer 442 may be a pressure sensitive adhesive. The barrier film 440 and the adhesion layer 442 may be omitted.

Alternatively, a polarization plate (not shown) may be attached on an outer side of the barrier film 440 to reduce ambient light reflection and increase a contrast ratio. In this instance, the polarization plate may be a circular polarization plate.

As mentioned above, by forming the metal pattern 430 having a low modulus property on the organic layer 424 of the encapsulation film 420, the generation of the cracks in the first inorganic layer 422 and the organic layer 424 of the encapsulation film 420 is prevented such that the damages on the elements, e.g., the light emitting diode D, by the moisture penetration is prevented.

Accordingly, the displaying quality and the lifetime of the flexible OLED display device 400 are improved, and a relatively small curvature radius can be provided in the flexible OLED display device 400.

In addition, since the metal pattern 430 is positioned in the bending region BR, the transmittance decrease of the flexible OLED display device 400 can be minimized.

Figure 7:
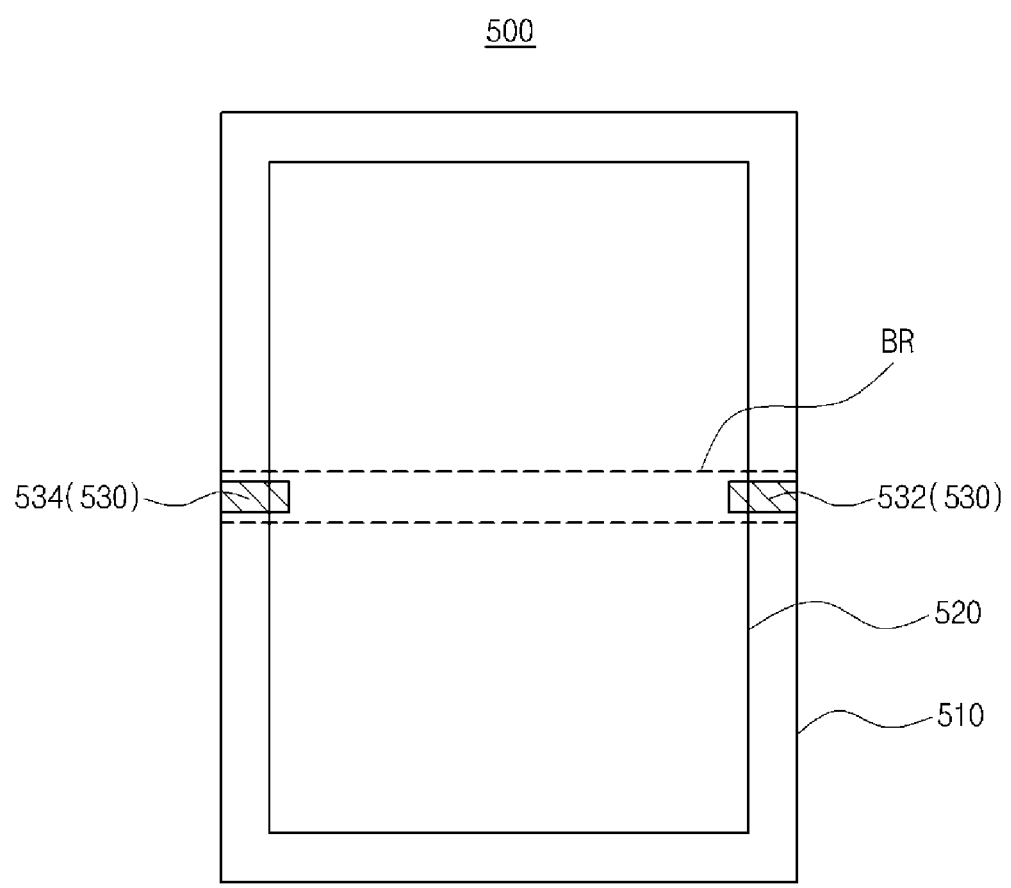
FIG. 7 is a schematic plane view of a flexible OLED display device according to a fifth embodiment of the present invention.
Figure 8:
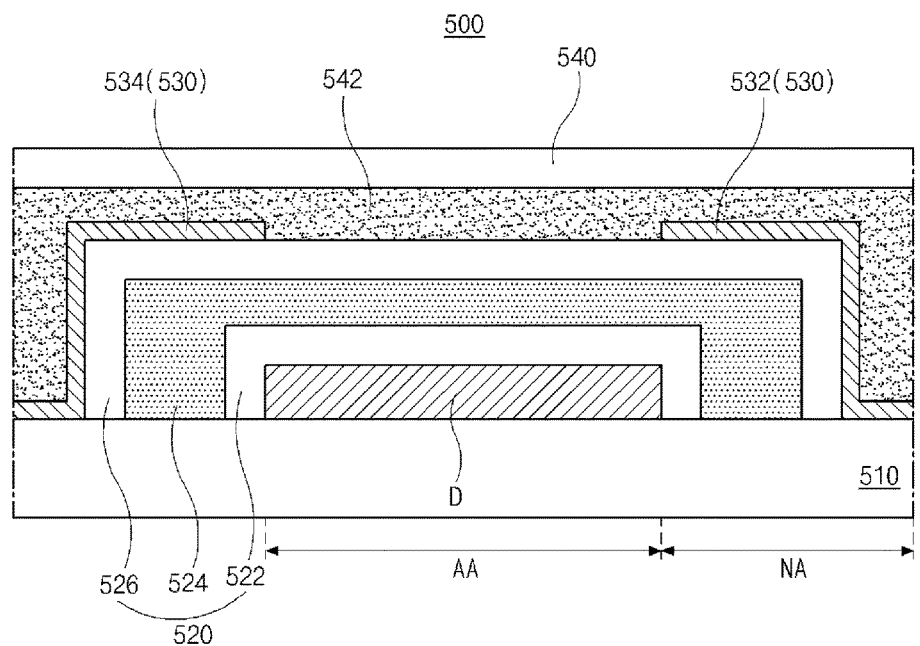
FIG. 8 is a schematic cross-sectional view of a flexible OLED display device according to the fifth embodiment of the present invention.

FIG. 7 is a schematic plane view of a flexible OLED display device according to a fifth embodiment of the present invention, and FIG. 8 is a schematic cross-sectional view of a flexible OLED display device according to the fifth embodiment of the present invention.

Referring to FIGS. 7 and 8, a flexible OLED display device 500 according to the fifth embodiment of the present invention includes a flexible substrate 510, where a display area AA and a non-display area NA at peripheries of the display area AA are defined, a light emitting diode D on the flexible substrate 510, an encapsulation film 520 covering the light emitting diode D, and a metal layer 530 positioned at both ends of a bending region BR (of FIG. 3) and covering the encapsulation film 520. A region, where the flexible OLED display device 500 of the present invention is folded, bent and/or rolled, is defined as the bending region BR.

The flexible substrate 510 may be formed of polymer such as polyimide. However, it is not limited thereto.

On or over the flexible substrate 510, a driving TFT Td and a light emitting diode D, which is connected to the driving TFT Td, is formed.

As illustrated with FIG. 4, the driving TFT Td includes the semiconductor layer 252, the gate electrode 260, the source electrode 270 and the drain electrode 272, and the light emitting diode D includes the first electrode 280, which is connected to the drain electrode 272, the second electrode 284, which faces the first electrode 280, and the organic emitting layer 282 therebetween.

The encapsulation film 520 is formed on the light emitting diode D to prevent the moisture penetration into the light emitting diode D.

The encapsulation film 520 has a triple-layered structure of the first inorganic layer 522, the organic layer 524 and the second inorganic layer 526. However, it is not limited thereto.

Each of the first and second inorganic layers 522 and 526 may be formed of at least one material selected from an inorganic material including silicon oxide (SiOx), silicon nitride (SiNx) and aluminum oxide (AlOx). However, it is not limited thereto. The organic layer 524 may be formed of a thermosetting or a UV curable material, e.g., epoxy compounds, acryl compounds, urethane compound, rubber compounds. However, it is not limited thereto.

For example, an organic layer may be further formed on the second inorganic layer 526 such that the encapsulation film 520 may have a quadruple-layered structure, or an organic layer and an inorganic layer may be stacked on the second inorganic layer 526 such that the encapsulation film 520 may have a five-layered structure.

The metal pattern 530 is positioned on the second inorganic layer 526 as an uppermost layer of the encapsulation film 520 and at the both ends of the bending region BR. Namely, the metal pattern 530 includes a first pattern 532 at one end of the bending region BR and a second pattern 534 at an opposite end of the bending region BR. In other words, the first and second patterns 532 and 534 are spaced apart from each other to cover edges of the encapsulation film 520 in the bending region BR and expose the light emitting diode D in the display area AA.

The first and second patterns 532 and 534 are spaced apart from each other, and facing ends of the first and second patterns 532 and 534 are matched ends of the display area AA.

Alternatively, the end of the first and second patterns 532 and 534 may partially cover the display area AA or may be disposed between the display area AA and a side surface of the second inorganic layer 526. In addition, the end of the first and second patterns 532 and 534 may be disposed at the side surface of the second inorganic layer 526 except an upper surface of the second inorganic layer 526.

In FIG. 8, the metal pattern 530 including the first and second patterns 532 and 534 is formed and disposed on the second inorganic layer 526 as an uppermost layer of the encapsulation film 520. In this instance, one end of each of the first and second patterns 532 and 534 contacts the upper surface of the second inorganic layer 526, and the other end of each of the first and second patterns 532 and 534 contacts an upper surface of the flexible substrate 510 or an uppermost layer on the flexible substrate 510.

Alternatively, as shown in FIGS. 5 and 6, the metal pattern 530 may be positioned inside the encapsulation film 520.

For example, the first and second patterns 532 and 534 may be positioned between the first inorganic layer 522 and the organic layer 524. In this instance, an end of each of the first and second patterns 532 and 534 may contact an upper surface of the first inorganic layer 522, and the other end of each of the first and second patterns 532 and 534 may contact an upper surface of the flexible substrate 510 or an uppermost layer on the flexible substrate 510.

The first and second patterns 532 and 534 may be positioned between the organic layer 524 and the second inorganic layer 526. In this instance, an end of each of the first and second patterns 532 and 534 may contact an upper surface of the organic layer 524, and the other end of each of the first and second patterns 532 and 534 may contact an upper surface of the flexible substrate 510 or an uppermost layer on the flexible substrate 510.

The metal pattern 530 may include a material of low stiffness. Namely, the metal pattern 530 may include a metallic material having a low modulus value. For example, the metal pattern 530 may include silver (Ag), gold (Au), paladium (Pd) or their alloys. However, it is not limited thereto.

Moisture is blocked and the stress concentrated in the encapsulation film 520 during the folding, bending and/or rolling operation is relieved by the metal pattern 530. Accordingly, the cracks are not generated in the encapsulation film 520 by the folding, bending and/or rolling operation.

A barrier film 540 further minimizing the moisture penetration and protecting the encapsulation film 520 may be attached onto the metal pattern 530 and the second inorganic layer 526 using an adhesion layer 542. For example, the adhesion layer 542 may be a pressure sensitive adhesive. The barrier film 540 and the adhesion layer 542 may be omitted.

Alternatively, a polarization plate (not shown) may be attached on an outer side of the barrier film 540 to reduce ambient light reflection and increase a contrast ratio. In this instance, the polarization plate may be a circular polarization plate.

As mentioned above, by forming the metal pattern 530 having a low modulus property on the encapsulation film 520, the generation of the cracks in the encapsulation film 520 is prevented such that the damages on the elements, e.g., the light emitting diode D, by the moisture penetration is prevented.

Accordingly, the displaying quality and the lifetime of the flexible OLED display device 500 are improved, and a relatively small curvature radius can be provided in the flexible OLED display device 500.

In addition, since the metal pattern 530 is positioned in the bending region BR, the transmittance decrease of the flexible OLED display device 500 can be minimized.

Moreover, since the first and second patterns 532 and 534 of the metal pattern 530 are positioned at the both ends of the bending region BR, the stress concentrated in the encapsulation film 520 at the ends of the bending region BR is relieved such that the damages, e.g., the cracks, generated in the encapsulation film 520 is further prevented, and the transmittance decrease of the flexible OLED display device 500 can be further minimized regardless of the thickness of the first and second metal patterns 532 and 534. Namely, since the first and second patterns 532 and 534 are spaced apart from each other to expose the display area AA, there is no transmittance decreased caused by the metal pattern 530.

Accordingly, the flexible OLED display device 500 having high displaying quality, long lifetime and a relatively smaller curvature radius without the transmittance decrease is provided.

Figure 9:
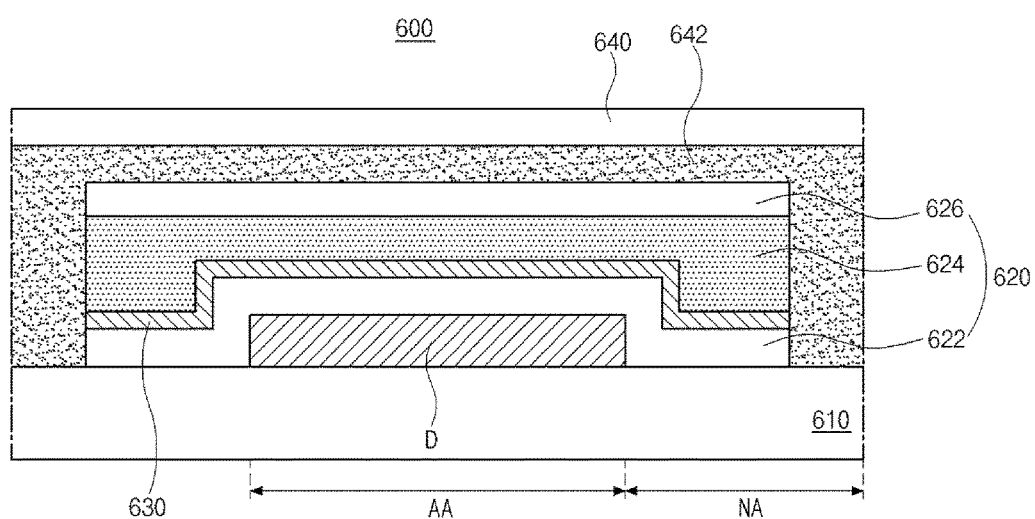
FIG. 9 is a schematic cross-sectional view of a flexible OLED display device according to a sixth embodiment of the present invention.

FIG. 9 is a schematic plane view of a flexible OLED display device according to a sixth embodiment of the present invention.

Referring to FIG. 9, a flexible OLED display device 600 according to the sixth embodiment of the present invention includes a flexible substrate 610, where a display area AA and a non-display area NA at peripheries of the display area AA are defined, a light emitting diode D, which is disposed on the flexible substrate 610, an encapsulation film 620, which covers the light emitting diode D and includes a first inorganic layer 622, an organic layer 624 and a second inorganic layer 626 sequentially stacked over the flexible substrate and on the light emitting diode D except a bending region BR (of FIG. 3), and a metal layer 630 positioned in a bending region BR (of FIG. 3) and between the first inorganic layer 622 and the organic layer 624. A region, where the flexible OLED display device 600 of the present invention is folded, bent and/or rolled, is defined as the bending region BR.

The flexible substrate 610 may be formed of polymer such as polyimide. However, it is not limited thereto.

On or over the flexible substrate 610, a driving TFT Td and a light emitting diode D, which is connected to the driving TFT Td, is formed.

As illustrated with FIG. 4, the driving TFT Td includes the semiconductor layer 252, the gate electrode 260, the source electrode 270 and the drain electrode 272, and the light emitting diode D includes the first electrode 280, which is connected to the drain electrode 272, the second electrode 284, which faces the first electrode 280, and the organic emitting layer 282 therebetween.

The encapsulation film 620 is formed on the light emitting diode D to prevent the moisture penetration into the light emitting diode D.

The encapsulation film 620 has a triple-layered structure of the first inorganic layer 622, the organic layer 624 and the second inorganic layer 626. However, it is not limited thereto.

Each of the first and second inorganic layers 622 and 626 may be formed of at least one material selected from an inorganic material including silicon oxide (SiOx), silicon nitride (SiNx) and aluminum oxide (AlOx). However, it is not limited thereto. The organic layer 624 may be formed of a thermosetting or a UV curable material, e.g., epoxy compounds, acryl compounds, urethane compound, rubber compounds. However, it is not limited thereto.

For example, an organic layer may be further formed on the second inorganic layer 626 such that the encapsulation film 620 may have a quadruple-layered structure, or an organic layer and an inorganic layer may be stacked on the second inorganic layer 626 such that the encapsulation film 620 may have a five-layered structure.

The metal pattern 630 is positioned between the first inorganic layer 622 and the organic layer 624 and in the bending region BR (of FIG. 3). Namely, unlike the second embodiment of the present invention, the metal pattern 630 in the flexible OLED display device 600 according to the third embodiment of the present invention runs through the encapsulation film 620. In addition, unlike the third embodiment of the present invention, the metal pattern 630 has substantially the same shape as the first inorganic layer 622.

Since the main or final element for preventing the moisture penetration into the light emitting diode D is the first inorganic layer 622, the metal pattern 630 is formed between the first inorganic layer 622 and the organic layer 624 to efficiently prevent the generation of the cracks in the first inorganic layer 622. Namely, the metal pattern 630 is formed to contact an upper surface of the first inorganic layer 622 which is closer to the light emitting diode D than other elements of the encapsulation film 620.

The metal pattern 630 has a length L, i.e., a horizontal length, being substantially equal to than the first inorganic layer 622 and being smaller than the flexible substrate 610. The width W of the metal pattern 630 may be determined according to a curvature radius of the flexible OLED display device 600.

The metal pattern 630 may include a material of low stiffness. Namely, the metal pattern 630 may include a metallic material having a low modulus value. For example, the metal pattern 630 may include silver (Ag), gold (Au), paladium (Pd) or their alloys. However, it is not limited thereto.

The metal pattern 630 may have a thickness of about 100 to 200 angstroms. When the metal pattern 630 has the thickness of the above range, the transmittance of the display device is increased due to the Surface Plasmon Effect.

Moisture is blocked and the stress concentrated in the first inorganic layer 622 of the encapsulation film 620 during the folding, bending and/or rolling operation is relieved by the metal pattern 630. Accordingly, the cracks are not generated in the first inorganic layer 622 of the encapsulation film 620 by the folding, bending and/or rolling operation.

In addition, since the metal pattern 630 is formed in the bending region BR, the transmittance decrease of the top emission type flexible OLED display device is minimized regardless of the thickness of the metal pattern 630.

A barrier film 640 further minimizing the moisture penetration and protecting the encapsulation film 620 may be attached onto the second inorganic layer 626 of the encapsulation film 620 using an adhesion layer 642. For example, the adhesion layer 642 may be a pressure sensitive adhesive.

The encapsulation film 620 and the barrier film 640 are stacked over the substrate 610, where the light emitting diode D is formed, and the metal pattern 630 is positioned between the light emitting diode D and the barrier film 640.

The barrier film 640 and the adhesion layer 642 may be omitted.

Alternatively, a polarization plate (not shown) may be attached on an outer side of the barrier film 640 to reduce ambient light reflection and increase a contrast ratio. In this instance, the polarization plate may be a circular polarization plate.

As mentioned above, by forming the metal pattern 630 having a low modulus property on the first inorganic layer 622 of the encapsulation film 620, the generation of the cracks in the first inorganic layer 622 of the encapsulation film 620 is prevented such that the damages on the elements, e.g., the light emitting diode D, by the moisture penetration is prevented.

Accordingly, the displaying quality and the lifetime of the flexible OLED display device 600 are improved, and a relatively small curvature radius can be provided in the flexible OLED display device 600. In addition, since the metal pattern 630 is positioned in the bending region BR, the transmittance decrease of the flexible OLED display device 600 can be minimized.

In the flexible OLED display device 200, 300, 400, 500 and 600 according to the first to sixth embodiments of the present invention, the encapsulation film 220, 320, 420, 520 and 620 and the barrier film 240, 340, 440, 540 and 640 are stacked on or over the light emitting diode D, and the metal pattern 230, 330, 430, 530 and 630 is positioned between the light emitting diode D and the barrier film 240, 340, 440, 540 and 640. As a result, the generation of the cracks in the encapsulation film 220, 320, 420, 520 and 620 is prevented, and the problems of decreasing the displaying quality and the lifetime of the flexible OLED display device 200, 300, 400, 500 and 600 by the moisture penetration are also prevented.

Figure 10:
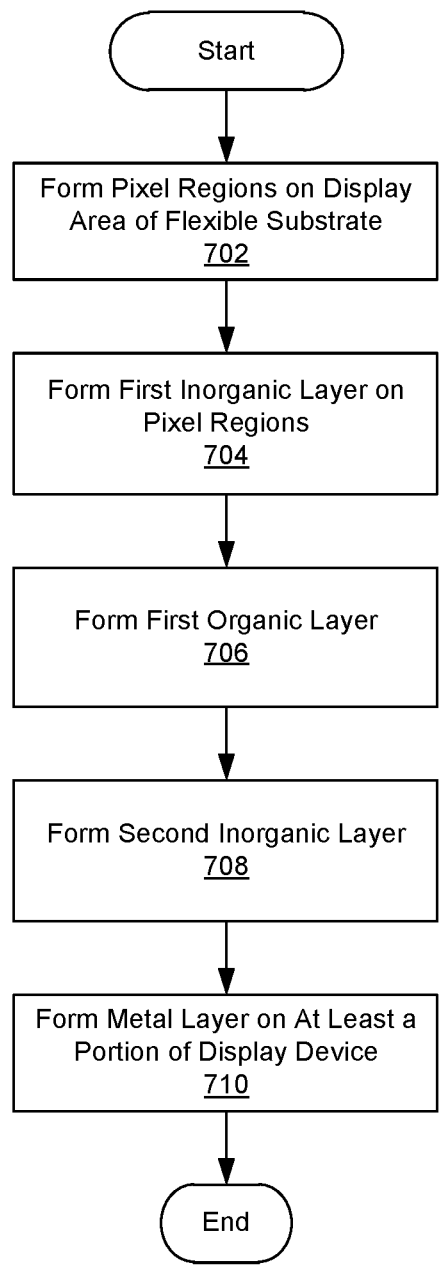
FIG. 10 is a flowchart illustrating a method of fabricating an organic light emitting diode (OLED) display device, according to one embodiment of the present invention.

FIG. 10 is a flowchart illustrating a method of fabricating an organic light emitting diode (OLED) display device, according to one embodiment of the present invention.

First, pixel regions are formed 702 on a display area of a flexible substrate. Each pixel region is formed with an organic light emitting diode. A first inorganic layer is formed 704 on the pixel regions. A first organic layer is formed 706 on the first inorganic layer, after forming the first inorganic layer. A second inorganic layer is formed 708 on the first organic layer, after forming the first organic layer.

A metal layer is formed 710 on at least a portion of the display device, after forming the pixel regions. In one embodiment, the metal layer may be formed 710 after forming 708 the second inorganic layer to be disposed above the second inorganic layer. In another embodiment, the metal layer may be formed 710 after forming 706 the first organic layer but before forming 708 the second inorganic layer. In yet another embodiment, the metal layer may be formed 710 after forming 704 the first inorganic layer but before forming 706 the first organic layer.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode (OLED) display device comprising:
   a flexible substrate having a display area and a non-display area;
   a plurality of pixel regions on the display area of the flexible substrate, each of the pixel regions including an organic light emitting diode;
   a multi-layered encapsulation film covering the plurality of pixel regions, the multi-layered encapsulation film comprising a first inorganic layer, a first organic layer, and a second inorganic layer; and
   a metal layer on or within at least a portion of the multi-layered encapsulation film, wherein the portion of the multi-layered encapsulation film is in a bending region of the flexible substrate where the flexible substrate is folded, bent, or rolled,
   wherein a first distance between both ends of the metal layer along a first direction is equal to or larger than a first distance between both ends of the encapsulation film along the first direction, and a second distance between both ends of the metal layer along a second direction perpendicular to the first direction is smaller than a second distance between both ends of the encapsulation film along the second direction,
   wherein the first direction and the second direction are parallel to a surface of the flexible substrate, and
   wherein the metal layer does not completely overlap the encapsulation film.

2. The display device of claim 1, wherein the metal layer spans an entire surface of the flexible substrate.

3. The display device of claim 1, wherein a first length of the metal layer along the first direction of the bending region is smaller or equal to a first length of the flexible substrate but larger than a first length of the encapsulation film.

4. The display device of claim 1, wherein the metal layer is above the second inorganic layer.

5. The display device of claim 1, wherein the metal layer is between the first inorganic layer and the first organic layer.

6. The display device of claim 3, wherein the first length of the metal layer is equal to a first length of the first inorganic layer.

7. The display device of claim 1, wherein the metal layer is between the first organic layer and the second inorganic layer.

8. The display device of claim 1, wherein the metal layer comprises:
   a first pattern on or within a first end of the encapsulation film, the first pattern extending from one end of the bending region; and
   a second pattern on or within a second end of the encapsulation film, the second pattern extending from an opposite end of the bending region and spaced apart from the first pattern.

9. The display device of claim 8, wherein the first and second patterns of the metal layer are above the second inorganic layer.

10. The display device of claim 8, wherein the first and second patterns of the metal layer are between the first inorganic layer and the first organic layer.

11. The display device of claim 8, wherein the first and second patterns of the first metal layer are between the first organic layer and the second inorganic layer.

12. The display device of claim 1, wherein the metal layer includes at least one of silver (Ag), gold (Au), palladium (Pd), or their alloys, and a thickness of the metal layer is 100 to 200 angstroms.

13. The display device of claim 1, wherein the display device further comprises an adhesion layer on the encapsulation film, a barrier film on the adhesion layer.

14. A method of fabricating an organic light emitting diode (OLED) display device comprising:
   forming a plurality of pixel regions on a display area of a flexible substrate, each of the pixel regions including an organic light emitting diode;
   forming a first inorganic layer on the plurality of pixel regions;
   forming a first organic layer, after forming the first inorganic layer;
   forming a second inorganic layer, after forming the first organic layer; and
   forming a metal layer on at least a portion of the display device, after forming the plurality of pixel regions, wherein the portion is in a bending region of the flexible substrate where the flexible substrate is folded, bend, or rolled,
   wherein a first distance between both ends of the metal layer along a first direction is equal to or larger than a first distance between both ends of the second inorganic layer along the first direction, and a second distance between both ends of the metal layer along a second direction perpendicular to the first direction is smaller than a second distance between both ends of the second inorganic layer along the second direction,
   wherein the first direction and the second direction are parallel to a surface of the flexible substrate, and
   wherein the metal layer does not completely overlap the second inorganic layer.

15. The method of claim 14, wherein the metal layer is formed across an entire surface of the flexible substrate.

16. The method of claim 14, wherein a first length of the metal layer along the first direction of the bending region is smaller or equal to a first length of the flexible substrate but larger than a first length of the second inorganic layer.

17. The method of claim 14, wherein forming the metal layer comprises:
   forming a first pattern extending from one end of the bending region; and
   forming a second pattern extending from another end of the bending region, the second pattern spaced apart from the first pattern.

18. The method of claim 14, wherein the metal layer is formed after forming the first inorganic layer but before forming the first organic layer, a first length of the metal layer equal to a first length of the first inorganic layer.

19. The method of claim 14, wherein the metal layer includes at least one of silver (Ag), gold (Au), palladium (Pd), or their alloys, and a thickness of the metal layer is 100 to 200 angstroms.

20. The method of claim 14, further comprising:
   forming an adhesion layer on the second inorganic layer; and
   forming a barrier film on the adhesion layer.

* * * * *